(12) United States Patent
Lee et al.

(10) Patent No.: US 6,730,572 B2
(45) Date of Patent: May 4, 2004

(54) METHOD OF FORMING SILICIDE

(75) Inventors: Key-Min Lee, Seoul (KR); Jae-Gyung Ahn, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 10/347,230

(22) Filed: Jan. 21, 2003

(65) Prior Publication Data

US 2003/0109116 A1 Jun. 12, 2003

Related U.S. Application Data

(62) Division of application No. 09/770,449, filed on Jan. 29, 2001, now Pat. No. 6,528,381.

(30) Foreign Application Priority Data

Jan. 28, 2000 (KR) .......................................... 2000-4245

(51) Int. Cl.$^7$ ............................................. H01L 21/331
(52) U.S. Cl. ........................ 438/373; 438/232; 438/582
(58) Field of Search ................................. 438/580, 584, 438/587, 592, 232, 302, 369, 370, 373, 473, 480, 514, 519

(56) References Cited

U.S. PATENT DOCUMENTS 4,555,842 A * 12/1985 Levinstein et al. ......... 438/232
6,162,716 A    12/2000 Yu et al.
6,177,335 B1 * 1/2001 Park et al. .................. 438/584

OTHER PUBLICATIONS

J.S. Byun et al., Effect of Deposition Temperature and Sputtering Ambient on In Situ Cobalt Silicide Formation, J. Electrochem. Soc., vol. 144, No. 0, Sep. 1997, The Electrochemical Society, Inc.

* cited by examiner

*Primary Examiner*—Dung A. Le
(74) *Attorney, Agent, or Firm*—Birch, Stewart, Kolasch & Birch, LLP

(57) ABSTRACT

A method of forming silicide, especially in a CMOS device in which polysilicon grains in a p-type gate are re-doped with n-type impurities such as As and the like at a critical implantation dose. This increases the grain size of the polysilicon, which also reduces sheet resistance by securing thermal stability in subsequent process steps thereof. The present invention generally includes forming an undoped polysilicon layer, doping the polysilicon layer with p-type impurity ions, doping the p-doped polysilicon layer with ions that increase the grain size of the polysilicon layer by being heated, forming a metal layer on the twice-doped polysilicon layer, and forming a silicide layer by reacting a portion of the twice-doped polysilicon layer with the metal layer.

29 Claims, 5 Drawing Sheets

METHOD OF FORMING SILICIDE

CROSS REFERENCE TO RELATED APPLICATIONS

This Application is a Divisional of the application Ser. No. 09/770,449, filed on Jan. 29, 2001, now U.S. Pat. No. 6,528,381.

BACKGROUND OF THE INVENTION

1. Field of Invention

The present invention relates to a method of forming a suicide, more particularly, to a method of forming Co silicide or salicide which provides an excellent p-type gate conductivity in dual gates consisting of fine grains for CMOS devices by increasing grain size in the p-type gate. The p-type gate is then re-doped with n-type impurities such as As or the like having a characteristic of increasing grain sizes within a critical dose, and which also reduces sheet resistance by securing thermal stability in following processing steps.

2. Discussion of Related Art

In an ultra highly integrated semiconductor device, the widths of impurity regions and gates are decreased. Thus, operation speed is reduced because contact resistance of the impurity region and sheet resistance of the gate are increased.

The contact and sheet resistances may be reduced by forming silicide layers on a gate electrode of doped polysilicon, or by forming electrodes of a semiconductor device with a low resistance substance such as Al alloy, W, or the like. In this case, another suicide layer may be formed on surfaces of the impurity regions as soon as the silicide layer is formed on the gate electrode of doped polysilicon. This is called a salicide structure which decreases contact resistance.

As mentioned above, the relatively high resistance of a gate is the major factor of reducing the operation speed of a semiconductor device because a design rule for a semiconductor device becomes more strict.

A line width or a critical dimension is scaled down to submicron range to improve operational characteristics and improve the degree of integration in semiconductor integrated circuits. This reduces spaces between adjacent gate lines of MOS transistors in the semiconductor integrated circuit. Naturally, parasitic capacitance among the gate lines increases greatly, thereby lowering the signal transferring speed of the circuit.

In such a semiconductor integrated circuit, the signal transferring speed is affected by a delay time, which depends on a line resistance R of a gate line and a parasitic capacitance C among gate lines.

Therefore, the line resistance or the parasitic capacitance is decreased by increasing an interval between the gate lines in order to improve the signal transferring speed of a circuit.

Unfortunately, it is hard to increase the degree of integration when increasing the spacing between the gate lines. Therefore, the delay time of a signal is instead reduced by decreasing the line resistance of the gate. In order to reduce the line resistance of the gate, a gate having a polycide structure is formed in which silicide is stacked on heavily doped polysilicon.

Fabricating a gate electrode having low resistance is essential to improve the operation speed of a device. For such improvement, a gate electrode of refractory metal silicide (with a low specific resistance) is fabricated. Such a gate electrode having has a polycide (silicide on doped polysilicon) structure.

Although $WSi_2$ is frequently used in the polycide structure, some silicide having a lower resistance is required for the reduced area occupied by a unit device because of the increased integration of the device. Besides, the specific resistance of $WSi_2$ is 60 to 200 $\mu\Omega$-cm. Therefore, $CoSi_2$ or $TiSi_2$ having a specific resistance of 15 to 20 $\mu\Omega$-cm meets this requirement.

Methods of forming a polycide structure may be divided into two categories. First, silicide may be formed by depositing a metal layer on a doped polysilicon and by reacting the metal with the doped polysilicon in a thermal treatment. In this case, the resultant polycide, which is relatively thick, fails to form a thick and uniform silicide layer.

Generally, the reaction between pure metal and silicon is very vigorous, creating a rough morphology at the interface between silicide and silicon. Therefore, it is hard to pattern a gate electrode precisely. This phenomenom is disclosed in detail in, for example, [J. S. Byun et al. J. Electrochem. Soc., vol. 144,3175(1997)].

Moreover, when fine-grained polysilicon is used to permit sufficient doping, the vigorous reaction between the doped polysilicon of which grain boundaries are much enhanced and the heavily-doping dopants fails to form an uniform polycide structure.

Second, there is a method forming polycide by depositing a silicide substance directly on a doped polysilicon, instead of reacting metal and silicon in a thermal treatment. Generally, a sputtering method is used to form a silicide layer on a doped polysilicon layer using a silicide composite target.

Unfortunately, this method lessens the reliability of a resultant semiconductor device due to particles generated from forming silicide as the integration degree of a device increases. Specifically, the sputtering rates of the respective elements in the composite target consisting of metal and silicon differ from each other, which prevents formation of a silicide layer having an uniform composition and causes the generation of particles.

As a CMOS transistor becomes highly integrated and sizes of NMOS and PMOS transistors are reduced accordingly, short channel effect and hot carriers ruin the characteristics of a device. Hence, the degradation of the NMOS and PMOS transistors is prevented by using an LDD(lightly doped drain) structure.

Gates of the NMOS and PMOS transistors of a CMOS device are heavily doped with n-type impurities commonly. Accordingly, a channel of the PMOS transistor is not formed in a top surface of a substrate but formed in a bulk of the substrate, thereby lowering breakdown voltage of the transistor due to punch through.

Therefore, a dual-gate CMOS transistor device is conventionally available in which a PMOS transistor has a heavily-doped gate doped with p-type impurities whereas the other gate of an NMOS transistor is heavily doped with n-type impurities. The channel of the PMOS transistor in such a dual-gate CMOS device is formed in a top surface of a substrate, thereby preventing the decrease of breakdown voltage due to punch-through.

The dual-gate CMOS transistor prevents a lowering of the signal transferring speed because of the increased integration of a device by reducing sheet resistance by forming a polycide gate structure consisting of heavily doped polysilicon and silicide.

Although very fine-grained polysilicon is required for doping a gate sufficiently because of scaling-down, thermal stability of silicide of $CoSi_x$ or the like of such polysilicon constitution is very poor because of the grain sizes participating directly in the silicidation reaction with Co.

Namely, silicidation occurs abruptly since the total surface area of the polysilicon grains is increased. Abrupt silicidation causes metal agglomeration in a subsequent thermal treatment, thereby drastically increasing sheet resistance.

FIG. 1A to FIG. 1D illustrate a method of forming suicide in a semiconductor device, in particular cross-sectional views of a dual-gate CMOS transistor device according to a related art.

Figure 1A:
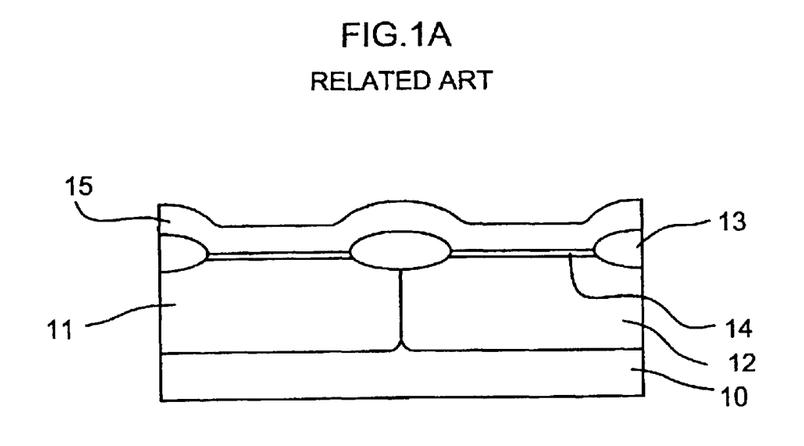
FIG. 1A to FIG. 1D illustrate a method of forming silicide in a semiconductor device according to a related art.

Referring to FIG. 1A, an n-well 11 and a p-well 12 are formed in predetermined portions of a semiconductor substrate 20 by doping the substrate selectively with n and p-type impurities, respectively.

A field oxide layer 13 electrically isolating unit devices is formed at a boundary between the n- and p-wells 11 and 12 by, for example, LOCOS (Local Oxidation of Silicon) or STI (shallow trench isolation). A gate insulating layer 14 is formed by thermally oxidizing surfaces of the n- and p-wells 11 and 12.

A silicon layer 15 is then formed on the field oxide layer 13 and the gate insulating layer 14 by depositing undoped polysilicon or amorphous silicon by chemical vapor deposition(hereinafter abbreviated CVD). If amorphous silicon is deposited, the amorphous silicon is transformed into polycrystalline silicon by a thermal treatment. In this case, the silicon layer 15 consisting of polycrystallites is made of fine grains to facilitate impurity doping to reduce gate resistance.

Figure 1B:
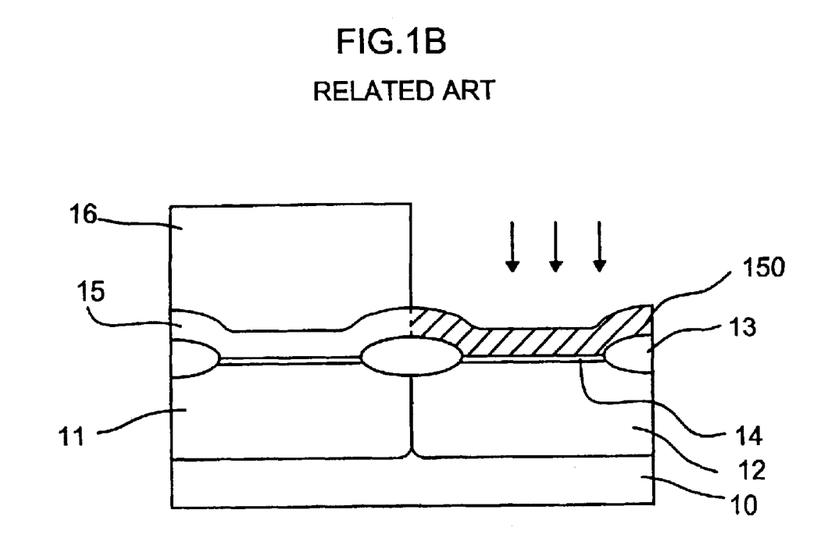

Referring to FIG. 1B, after the silicon layer 15 has been coated with photoresist, a first photoresist pattern 16 exposing a portion of the silicon layer 15 over the p-well 12 region is formed by carrying out exposure and development.

A first polysilicon layer 150 doped with n-type impurities is formed by carrying out ion-implantation with n-type impurities such as As or the like on the exposed portion of silicon layer 15 over p-well region 12 using the first photoresist pattern 16 as an ion-implanting mask. The doped first polysilicon layer 150 will be patterned to become a gate of an NMOS transistor.

Figure 1C:
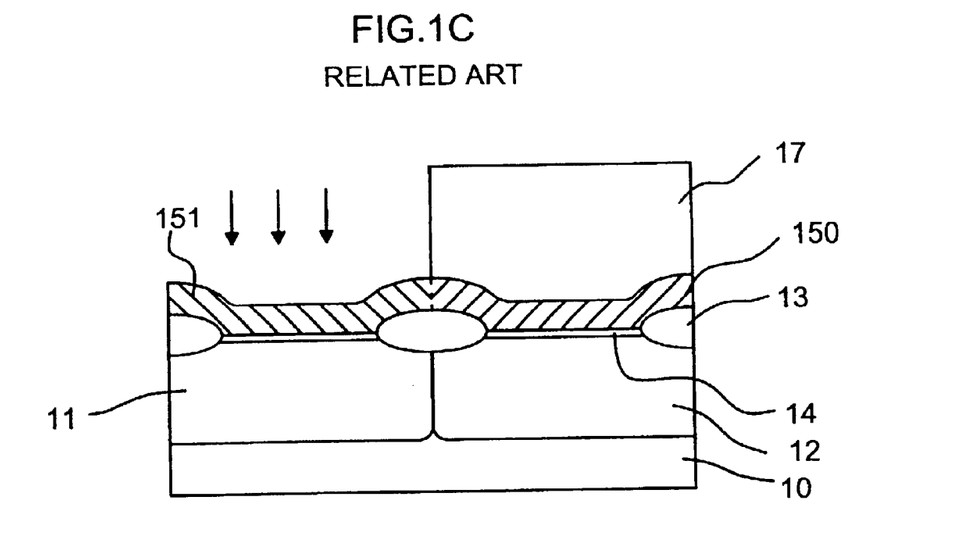

Referring to FIG. 1C, the portion of silicon layer 15 over the n-well 11 region which is not doped is exposed by removing the first photoresist pattern 16 by $O_2$ ashing or the like.

After the exposed undoped portion of silicon layer 15 and the doped first polysilicon layer 150 doped with n-type impurities have been coated with another photoresist, a second photoresist pattern 17 exposing the undoped portion of silicon 15 layer over the n-well 11 region is formed by carrying out exposure and development.

Then, a second polysilicon layer 151 doped with p-type impurities is formed by carrying out ion-implantation with p-type impurities such as B, BF2 or the like using the second photoresist pattern 17 as an ion-implanting mask. The doped second polysilicon layer 151 will be patterned to become a gate of an PMOS transistor.

Figure 1D:
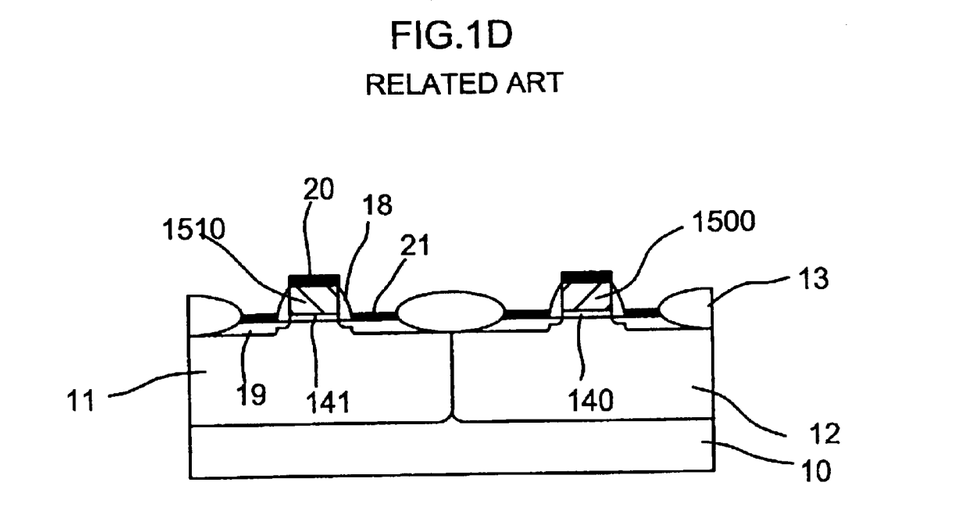

Referring to FIG. 1D, the doped first polysilicon layer 150 formed over the p-well 12 region is exposed by removing the second photoresist pattern 17 by $O_2$ ashing or the like.

From now on, the description will be continued with respect to two conventional embodiments, including a method of fabricating a CMOS device with gate electrodes that are formed with the polycide structure only, and a method of forming the salicide structure including silicide formed on impurity diffusion regions and on a gate electrode.

First, a method of fabricating a CMOS device having the salicide structure is explained in the following description.

An n-type gate 1500 consisting of polysilicon doped with n-type impurities and a p-type gate 1510 consisting of polysilicon doped with p-type impurities are formed by patterning the first polysilicon layer 150 doped with n-type impurities and the second polysilicon layer 151 doped with p-type impurities by photolithography, respectively. In this case, the oxide layer is also patterned to form first and second gate insulating layers 140 and 141 between the gates 1500 and 1510 and n-well 11 and p-well 12, respectively.

And, by using a general method of fabricating, a CMOS transistor device, gate sidewall spacers 18 and impurity diffusion regions 19 are formed corresponding to the n-type and p-type gates 1500 and 1510, respectively. In this case, the impurity diffusion regions 19 of the n-type gate 1500 are formed by doping an active region of the substrate with n-type impurity ions, while the other impurity diffusion regions 19 of the p-type gate 1510 are formed by doping the other active region with p-type impurity ions. Also, the impurity diffusion regions 19 may be formed to have LDD (lightly doped drain) structures.

A metal layer (not shown in the drawing) is formed over the substrate including a top surface of the exposed n-type gate 1500 of silicon and exposed surfaces of the impurity diffusion regions 19 by depositing Co, Ti or the like by sputtering for forming silicide. In this case, the metal layer is formed to a thickness corresponding to a desired height of the final polycide structure gate electrodes by being added to the height of each of the gates 1500 and 1510.

Silicide layers 20 and 21 for reducing electrode resistance are formed on the gates 1500 and 1510 and the impurity diffusion regions 19 to provide the final gate electrodes having the polycide structure by reacting the metal layer with silicon by carrying out rapid thermal annealing on the silicon and metal layers. In this case, the step of forming silicide layers on both the gate electrode and the impurity diffusion regions is called salicidation, thereby forming the salicide structure. The remaining metal layer not used in the salicidation process is removed.

Second, a method of fabricating a CMOS device having gates including the polycide structure is explained in the following description, which is continued successively after the steps in FIG. 1C.

After the doped first polysilicon layer 150 formed over the p-well 12 region has been exposed by removing the second photoresist pattern 17 by $O_2$ ashing or the like, a metal layer is formed on the doped first and second polysilicon layers 150 and 151 by depositing refractory metal such as Co, Ti and the like.

A silicide layer is formed on the doped first and second polysilicon layers 150 and 151 by reacting silicon with the metal layer by carrying out thermal treatment such as annealing on the substrate.

Gates are formed by patterning predetermined portions of the silicide layer, the first and second polysilicon layers, and the gate insulating layers by photolithography.

Impurity diffusion regions are formed by implanting n-type impurities such as As, P, etc. in the p-well and p-type impurities such as B, BF2, etc. in the n-well using the gates as an implantation mask, respectively. The impurity diffusion regions may have LDD structures by adding gate sidewall spacers to sides of the respective gates.

As mentioned in the above explanation, when $CoSi_x$ is formed by using fine-grained polysilicon consisting of a plurality of fine grains as a matrix under the design rule of 0.25 μm, the morphology of the interface between the suicide layer and the fine-grained polysilicon layer is rough and nonuniform because silicidation occurs abruptly.

The non-uniformity causes agglomeration of the silicide layer ($CoSi_x$), thereby increasing sheet resistance. Therefore, it is difficult to use fine-grained polysilicon having excellent gate doping efficiency.

Namely, the gate doped with p-type impurities of which grain sizes has not been changed brings about metal agglomeration, thereby degrading characteristics of sheet resistance so as to become similar to that of undoped polysilicon. Hence, using polysilicon of fine grains for a gate has a benefit of increasing gate doping efficiency but it degrades thermal stability of the silicide.

SUMMARY OF THE INVENTION

Accordingly, the present invention is directed to a method of forming silicide that substantially obviates one or more of the problems due to limitations and disadvantages of the related art.

An object of the present invention is to improve sheet resistance and thermal stability of silicide consisting of Co and the like by forming n-type and p-type polysilicon layers for forming dual-gates. Each of the polysilicon layers is doped with opposite conductivity type impurities and is formed by growing the grain size of the p-type polysilicon layer by additionally doping the p-type polysilicon layer only with n-type impurities such as As, etc. at a critical density of 1E19 to 5E20ions/cm³.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes forming an undoped polysilicon layer consisting of a plurality of grains, doping the polysilicon layer with p-type impurity ions, doping the doped polysilicon layer with ions that increase the grain sizes of the polysilicon layer by being heated, forming a metal layer for silicidation on the twice-doped polysilicon layer, and forming a silicide layer by reacting a portion of the polysilicon layer with the metal layer.

In another aspect, the present invention includes forming a gate insulating layer on a semiconductor substrate, forming a polysilicon layer consisting of a plurality of grains on the gate insulating layer, doping the polysilicon layer with p-type impurity ions, doping the doped polysilicon layer with ions for increasing the grain size of the polysilicon layer by being heated, forming a metal layer for silicidation on the twice doped polysilicon layer to a predetermined thickness, forming a silicon-metal compound layer by reacting a portion of the twice doped polysilicon layer with the metal layer, patterning the silicon-metal compound layer, the polysilicon layer remaining from forming the silicon-metal compound layer and the gate insulating layer to form a gate electrode pattern consisting of the remaining part of the silicon-metal compound layer, the polysilicon layer and the gate insulating layer, and forming a pair of impurity diffusion regions facing each other laterally under the gate electrode pattern in the semiconductor substrate and forming an insulating sidewall spacer at a side of the gate electrode pattern.

In another aspect, the present invention includes forming a gate insulating layer on a semiconductor substrate, forming a polysilicon layer consisting of a plurality of grains on the gate insulating layer, doping the polysilicon layer with p-type impurity ions, doping the doped polysilicon layer with ions for increasing grain sizes of the polysilicon layer by being heated, patterning the polysilicon layer and the gate insulating layer to form a gate electrode pattern consisting of the patterned polysilicon layer and the gate insulating layer, forming a pair of impurity diffusion regions facing each other laterally under the gate electrode pattern in the semiconductor substrate and forming an insulating sidewall spacer of insulator at a side of the gate pattern, forming a metal layer on the gate electrode pattern and the impurity diffusion regions to a predetermined thickness, and forming a metal-silicon compound layer and a metal-semiconductor compound layer by reacting the metal layer with a remaining portion of the polysilicon layer and the semiconductor substrate in the impurity diffusion regions, respectively.

In a further aspect, the present invention includes forming a p-well and an n-well separated by a device-isolating layer in predetermined portions of a semiconductor substrate, forming a gate insulating layer on the p- and n-wells, forming a first polysilicon layer doped with n-type impurities on the insulating layer over the p-well and forming a second polysilicon layer doped with p-type impurities on the insulating layer over the n-well, doping the second polysilicon layer with ions for increasing grain sizes of polysilicon by being heated, patterning the first and second polysilicon layers and the insulating layer to form first and second gate electrode patterns, forming a pair of impurity diffusion regions facing each other laterally under each of the first and second gate electrode patterns in the semiconductor substrate and forming an insulating sidewall spacer at a side of each of the first and second gate electrode patterns, respectively, thereby forming an NMOS transistor and a PMOS transistor in the p- and n-wells, respectively, forming a metal layer on the first and second gate electrode patterns and on the impurity diffusion regions to a predetermined thickness, forming a metal-silicon compound layer and a metal-semiconductor compound layer by reacting the metal layer with remaining portion of the first and second polysilicon layers and the semiconductor substrate in the impurity diffusion regions, respectively.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF PREFERRED EMBODIMENTS

Reference will now be made in detail to preferred embodiments of the present invention, examples of which are illustrated in the accompanying drawings.

The present invention relates to a method of forming silicide containing Co and the like by controlling the grain size of polysilicon participating in the silicidation reaction. The grain size is controlled by a critical doping density of As ions, thereby forming a gate that is very thermally stable, and has improved operational characteristics of a p-type gate in a dual-gate CMOS device.

In this case, a metal oxide silicon field effect transistor (hereinafter abbreviated MOSFET) of a CMOS device is fabricated by forming n-type and p-type polysilicon layers, respectively, for forming dual gates by ion implantation and by additionally doping the p-type polysilicon layer with As ions at a critical density of $1E19$–$5E20$ ions/cm$^3$.

In order to reduce the sheet resistance of a gate electrode, undoped polysilicon should be doped sufficiently, for which fine grained polysilicon is used. Unfortunately, the total surface area of the grain boundaries increases, which provides more diffusion passages for metal ions after silicidation using such polysilicon. This makes silicidation occur abruptly and causes agglomeration due to subsequent thermal steps. Thus, thermal stability is degraded, which increases sheet resistance of a gate.

Once the grain size of the polysilicon is reduced, the probability of diffusion through the grain interfaces becomes high. On the other hand, if the polysilicon grains are relatively large, the probability of ion diffusion through the interfaces is significantly lower in the same volume. Namely, diffusion in small-sized grains occurs easily because of the increased interface area, while diffusion in large-sized grains is inhibited since the total area of the grain interfaces as diffusion paths is lowered.

Accordingly, the present invention uses the fact that As ions doped in a polysilicon layer at the critical doping density of $1E19$–$5E20$ ions/cm$^3$ increases the sizes of grains thereof. At a doping density higher than $5E20$ ions/cm$^3$, grain growth is inhibited.

In order to reduce electric resistance of polysilicon used for a gate, the polysilicon should be sufficiently doped with impurities. Thus, polysilicon grain growth is induced by implanting ions such as As and the like which control grain growth in various polysilicon structures such as fine grain polysilicon, columnar polysilicon, etc.

Therefore, the present invention for a semiconductor device of which design rule is under 0.25 μm reduces parasitic capacitance, and secures stable sheet resistance characteristics by improving line independency of sheet resistance to improve thermal stability of silicide of Co and the like.

As mentioned in the above description of a CMOS transistor device, a dual gate CMOS transistor device has been developed comprising PMOS and NMOS transistors having gates doped with p-type and n-type impurities, respectively, to prevent breakdown voltage from being lowered by punch-through. As a channel of the PMOS transistor is formed beneath the substrate or an n-well, breakdown voltage of the transistor is lowered by punch-through.

In order to improve the signal transferring speed delayed by the increase of integration, a dual gate CMOS transistor includes a polycide structure gate consisting of silicide and polysilicon doped heavily with impurities. Grain growth is induced by As ions at a density per unit volume of polysilicon between $1E19$ and $5E20$ ions/cm$^3$. On the other hand, grain growth is inhibited if the As ion doping density per unit volume of polysilicon exceeds $5E20$ ions/cm$^3$, which is because excessive ions are extracted on grain boundaries.

When dual gates are formed with polysilicon, grains grow in polysilicon for an n-type gate doped with n-type impurities such as As and the like, whereas grains of the other polysilicon for a p-type gate doped with p-type impurities such as B, BF2 and the like have no change in size after successive thermal processes.

For such reasons, the sheet resistance of the p-type gate after the step of forming Co silicide is degraded. Therefore, the present invention enhances grain growth to secure thermal stability of Co silicide by additionally doping the p-type gate with As ions to the amount of critical density.

As a result, when a gate is formed by doping polysilicon consisting of fine grains, impurity doping sufficient for excellent electric conductivity is achieved as well as a characteristic of sheet resistance is improved greatly.

FIG. 2A to FIG. 2E show a method of forming suicide in a semiconductor device, particularly illustrating a cross-sectional view of fabricating a dual gate CMOS transistor device according to the present invention.

Figure 2A:
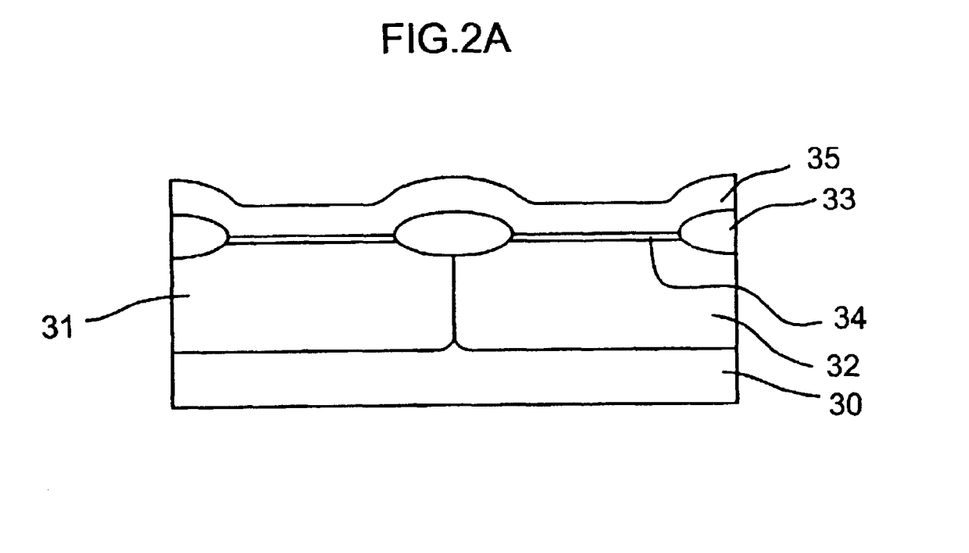
FIG. 2A to FIG. 2E illustrate a method of forming silicide in a semiconductor device, particularly a dual-gate CMOS transistor device according to the present invention.

Referring to FIG. 2A, a p-well 31 and an n-well 32, which become active regions of the CMOS device, are formed in predetermined portions of a semiconductor substrate 30 of silicon by doping the substrate 30 selectively with p- and n-type impurities, respectively.

A field oxide layer 33 for electrically isolating unit devices is formed at a boundary between the p and n wells 31 and 32 by, for example. LOCOS (Local Oxidation of Silicon) or STI (shallow trench isolation).

A gate insulating layer 34 is formed by, for example, oxidizing surfaces of the n- and p-wells 31 and 32.

A silicon layer 35 is formed by depositing undoped polysilicon or amorphous silicon on the field oxide layer 33 and the gate insulating layer 34 by chemical vapor deposition (hereinafter abbreviated CVD).

In this case, an additional step of turning amorphous silicon into polysilicon is carried out by a thermal treatment if amorphous silicon is deposited for forming a gate.

The polysilicon layer 35 consists of fine grains to facilitate an impurity doping process that reduces gate resistance. The probability of ion diffusion increases when the size of the grains decreases, which is because implanted ions tend to migrate through the interfaces among the grains.

On the other hand, the probability of ion diffusion through the grain boundaries is greatly reduced if the size of the grains per unit volume is relatively large. Namely, the diffusion takes place easily through the boundaries if the grain size is small, while the diffusion is inhibited by large grains of which total surface area becoming diffusion paths of ions is reduced.

Figure 2B:
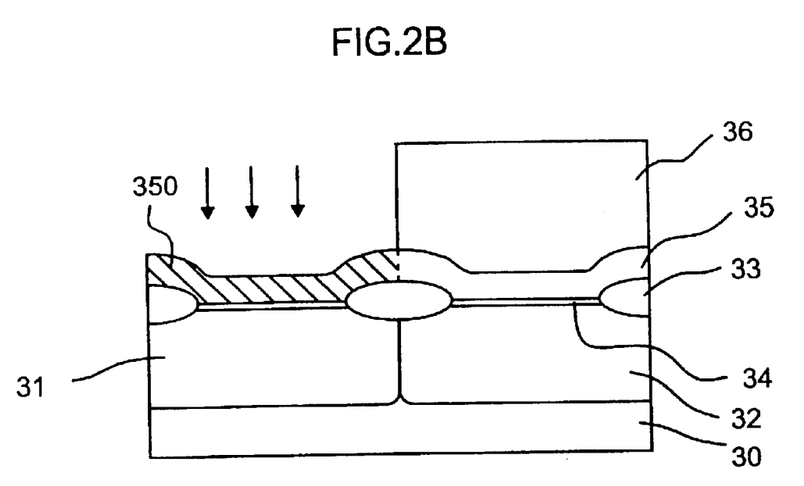

Referring to FIG. 2B, after the silicon layer 35 has been coated with photoresist, a first photoresist pattern 36 exposing a portion of the silicon layer 35 over the p-well 31 region is formed by exposing and developing the photoresist using an exposure mask defining the area over the p-well 31.

A first polysilicon layer 350 doped with n-type impurities is formed by implanting n-type impurity ions (such as As and the like) selectively into the exposed part of silicon layer 35 over the p-well 31 region using the first photoresist pattern 36 as an ion implantation mask. In this case, the first polysilicon 350 is doped at a dose of about $5E15$ ions/cm$^2$, and will be later patterned to become a gate of an NMOS transistor.

Figure 2C:
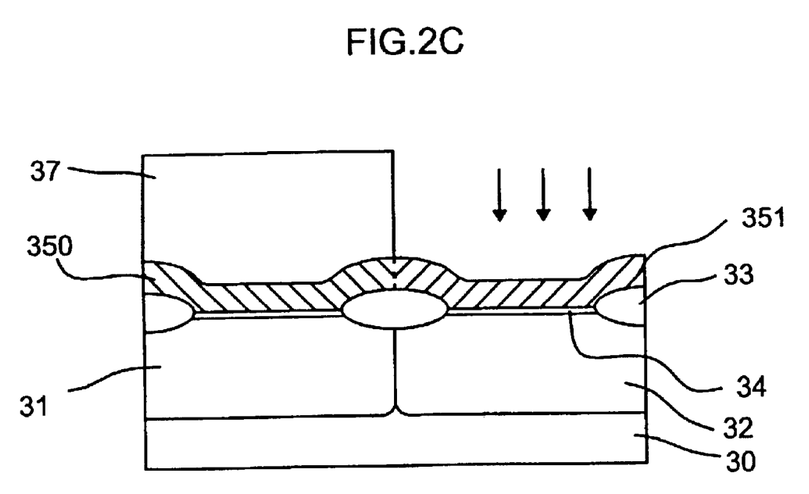

Referring to FIG. 2C, the undoped portion of the silicon layer 35 over the n-well 32 is exposed by removing the first photoresist pattern 36 by means of $O_2$ ashing or the like Next, surfaces of the exposed silicon layer and the first polysilicon layer 350 doped with n-type impurities are coated with another photoresist, and a second photoresist pattern 37 exposing the surface of the undoped silicon layer 35 over the n-well 32 region is formed exposing and developing the photoresist using an exposure mask having a reversed pattern than the first exposure mask for forming the first photoresist pattern 36.

Then, a second polysilicon layer 351 doped with p-type impurities is formed by implanting p-type impurity ions (such as B, BF2 and the like) selectively into the exposed silicon layer over the n-well 32 region, using the second photoresist pattern 37 as another ion implantation mask. In this case, the second polysilicon layer 351 is doped at a dose of about $5E15$ ions/cm$^2$, and will be later patterned to become a gate of a PMOS transistor.

The conductivity types of the transistors which are fabricated coincide with the impurities used to dope the polysilicon layers. This prevents breakdown voltage of the transistors from being decreased by punch-through.

Figure 2D:
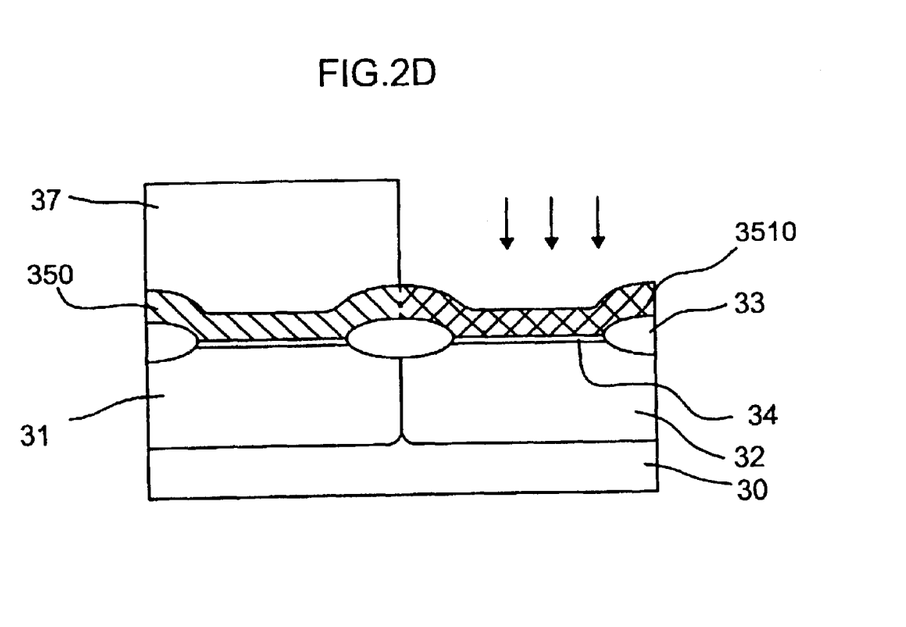

Referring to FIG. 2D, the exposed second polysilicon layer is doped again with ions that increase the grain size of the polysilicon using the second photoresist pattern 37 as an ion implantation mask. The present invention uses As ions doped at the critical doping density. In this case, the critical doping density means the maximum doping density of ions a unit volume can accommodate.

As a result of the additional doping, a third polysilicon layer 3510 doped with both the p-type and n-type ions is formed. Namely, the second polysilicon layer is transformed into the third polysilicon layer 3510 by being doped with the opposite type of impurities from the first ion implantation.

In this case, the third polysilicon layer 3510 is formed to maintain a doping density of $1E19–5E20$ ions/cm$^3$. Namely, once the polysilicon layer is doped with As ions at a doping density of $1E19$ to $5E20$ ions/cm$^3$, the grain size of the polysilicon increases. However grain growth is inhibited when the doping density exceeds $5E20$ ions/cm$^3$.

Besides, the density of the p-type impurities dominates (i.e., is greater), provided that the As ion implantation density lies between $1E19$ and $5E20$ ions/cm$^3$, because the third polysilicon layer 3510 is doped with the p-type impurities at about $5E15$ ions/cm$^2$. Therefore, a reverse effect of counter doping is negligible.

Figure 2E:
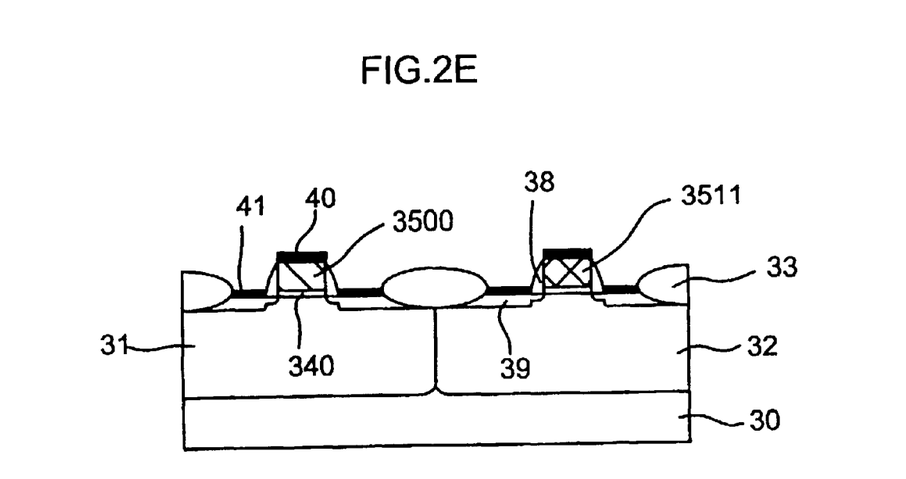

Referring to FIG. 2E, the first polysilicon layer 350 doped with n-type impurities formed over the p-well 31 region is exposed by removing the second photoresist pattern 37 by $O_2$ ashing or the like.

From now on, the description will be divided into two ways for explaining two embodiments: a method of fabricating a CMOS device in which gate electrodes have a polycide structure only; and a method of forming a salicide structure having silicide on impurity diffusion regions as well as on a gate electrode.

First, a method of fabricating a CMOS device having the salicide structure is explained in the following description, which will be explained by referring to FIG. 2E.

Referring to FIG. 2E, an n-type gate 3500 (consisting of polysilicon doped with n-type impurities) and a p-type gate 3511 (consisting of polysilicon doped with p-type impurities) are formed by patterning the first polysilicon layer 350 and the third polysilicon layer 3510 doped with both p-type impurities and n-type As ions by photolithography, respectively. In this case, the oxide layer is also patterned to form gate insulating layers 340 between the gates 3500 and 3511 and the p-type and n-type wells 31 and 32, respectively.

Using conventional methods, gate sidewall spacers 38 and impurity diffusion regions 39 are formed in predetermined portions of the substrate 30 corresponding to the n-type and p-type gates 3500 and 3511, respectively. In this case, the impurity diffusion regions 39 of the n-type gate 3500 are formed by doping an active region of the substrate with n-type impurity ions (such as As and the like), while the other impurity diffusion regions 39 of the p-type gate 3511 are formed by doping the other active region with p-type impurity ions (such as B, BF2, etc.). In addition, the impurity diffusion regions 39 may be formed to have LDD (lightly doped drain) structures.

A metal layer (not shown in the drawing) is formed over the substrate, including a top surface of the exposed n-type and p-type gates 3500 and 3511 and exposed surfaces of the impurity diffusion regions 39, by depositing Co, Ti or the like by sputtering. In this case, the metal layer is formed to a thickness corresponding the desired height of final polycide gate electrodes by being added to the height of each of the gates 3500 and 3511.

Silicide layers 40 and 41 are then formed on the gates 3500 and 3511 and on the impurity diffusion regions 39 by reacting the metal layer with silicon by carrying out a rapid thermal annealing of the silicon and metal layers. In this case, forming silicide layers 40 and 41 on both gate electrodes 3500 and 3511 and impurity diffusion regions 39 is called salicidation, thereby forming a salicide.

The remaining metal layer having not participated in the salicidation reaction is removed selectively.

Therefore, a CMOS transistor device is provided in which both sheet and contact resistances are reduced simultaneously by the silicide layers 40 and 41.

Second, a method of fabricating a CMOS device of which gates have the polycide structure is explained in the following description, which is continued successively after the steps in FIG. 2D.

Although not shown in the drawings, after the first polysilicon layer doped over the p-well region has been exposed by removing the second photoresist pattern by $O_2$ ashing or the like, a metal layer is formed on the first and third polysilicon layers by depositing refractory metal such as Co, Ti or the like.

A silicide layer is formed on the first and third polysilicon layers by reacting silicon with metal by a thermal treatment such as annealing.

In this case, the first polysilicon layer for forming a gate of an NMOS device is doped with As ions to provide electric conductivity while the third polysilicon layer is doped with As ions at the critical doping density. Therefore, grains of the first and third polysilicon layers grow, thereby improving thermal stability of a resulting gate by preventing agglomeration of silicide.

Gates of NMOS and PMOS transistors are formed by patterning predetermined portions of the suicide layer, the first and third polysilicon layers, and the gate insulating layers by photolithography, wherein gate insulating layers are provided between the gates and the substrate.

Then, impurity diffusion regions are formed by implanting n-type impurities such as As, P, etc. in the p-well and p-type impurities such as B, BF2, etc. in the n-well using the gates as mask, respectively. Also, the impurity diffusion regions may be formed to have LDD structures by adding gate sidewall spacers to sides of the respective gates in a known manner.

In the present invention, polysilicon is doped with As ions at the critical doping density to increase the grain size of the polysilicon (that has already been doped with p-type impurities) in a successive thermal process.

Also, the preferred embodiments of the present invention may employ various ions for facilitating doping of the polysilicon for a gate and providing secure thermal stability of Co silicide.

Grain growth of polysilicon doped with As ions is induced if the doping density of As ions is between 1E19 and 5E20 ions/cm$^3$. Thus, the present invention improves sheet resistance characteristics of a gate electrode by securing thermal stability of Co silicide by increasing grain sizes of polysilicon, which is achieved by doping the polysilicon (having already been doped with p-type impurities such as B, BF2, etc.) with As ions at the critical doping density.

Accordingly, the present invention enables the fine grained polysilicon to be sufficiently doped with impurity ions so as to provide electric conductivity as well as to improve sheet resistance characteristics of a gate.

It will be apparent to those skilled in the art that various modifications and variations can be made in a method of forming silicide of the present invention without departing from the spirit or scope of the inventions. Thus, it is intended that the present invention cover the modifications and variations of this invention provided they come within the scope of the appended claims and equivalents.

What is claimed is:

1. A method of forming a gate electrode comprising:
   forming a gate insulating layer on a semiconductor substrate;
   forming a polysilicon layer comprising grains on the semiconductor substrate;
   doping the polysilicon layer with p-type impurity ions;
   doping the p-doped polysilicon layer with n-type impurity ions for increasing the size of the grains;
   forming a metal layer on the twice-doped polysilicon layer;
   reacting the metal layer and the twice-doped polysilicon layer to obtain a silicon-metal compound layer on the twice-doped polysilicon layer to obtain a silicon-metal compound layer on the twice-doped polysilicon layer; and
   patterning the silicon-metal compound layer, the twice-doped polysilicon layer, and the gate insulating layer to obtain a gate electrode having a gate insulating layer interposed between the gate electrode and the semiconductor substrate.

2. The method of claim 1, wherein the doping of the p-doped polysilicon layer comprises doping with As ions.

3. The method of claim 1, wherein the doping of the p-doped polysilicon layer comprises doping with As ions.

4. The method of claim 3, wherein the As ions are doped at a doping density of 1E19 to 5E20 ions/cm$^3$.

5. The method of claim 1, wherein the metal layer is made from a material selected from the group consisting of Ti, W, Mo, Co, Ta, and Pt.

6. The method of claim 1, wherein the p-type impurity ions include a Group IIIB element.

7. The method of claim 1, wherein the formed polysilicon layer is an undoped polysilicon layer.

8. The method of claim 1, wherein the polysilicon layer comprises columnar polysilicon.

9. The method of claim 1, wherein reacting the metal layer and the twice-doped polysilicon layer comprises annealing the metal layer and the twice-doped polysilicon layer.

10. The method of claim 1, wherein the metal-silicon compound layer is a CoSi$_x$ layer.

11. The method of claim 1, wherein forming a metal layer on the twice-doped polysilicon layer comprises sputtering a metal onto the twice-doped polysilicon layer.

12. A method of forming a PMOS transistor comprising:
   forming a gate insulating layer on a semiconductor substrate;
   forming a polysilicon layer comprising grains on the semiconductor substrate;
   doping the polysilicon layer with p-type impurity ions;
   doping the p-doped polysilicon layer with n-type impurity ions for increasing the size of the grains;
   forming a metal layer on the twice-doped polysilicon layer;
   reacting the metal layer and the twice-doped polysilicon layer to obtain a silicon-metal compound layer on the twice-doped polysilicon layer;
   patterning the silicon-metal compound layer, the twice-doped polysilicon layer, and the gate insulating layer to obtain a gate electrode having a gate insulating layer interposed between the gate electrode and the semiconductor substrate;
   forming impurity diffusion regions adjacent to the gate electrode; and
   forming an insulating sidewall on the gate electrode.

13. A method for forming a semiconductor device comprising:
   forming a gate insulating layer on semiconductor substrate;
   forming a polysilicon layer comprising grains on the gate insulating layer;
   doping the polysilicon layer with p-type impurity ions;
   doping the p-doped polysilicon layer with n-type impurities to increase the size of the grains;
   patterning the twice-doped polysilicon layer and the gate insulating layer to obtain a gate electrode formed on the gate insulating layer;
   forming impurity diffusion regions in the semiconductor substrate adjacent to the gate electrode;
   forming an insulating sidewall on a side of the gate electrode;
   forming a metal layer over the gate electrode and the impurity diffusion regions; and
   reacting the metal layer with the twice-doped polysilicon of the gate electrode and the impurity diffusion regions to obtain a metal-silicon compound layer formed on the gate electrode and the impurity diffusion regions, respectively.

14. The method of claim 13, wherein the doping of the p-doped polysilicon layer with p-type impurities comprises doping at a doping density at which ions are precipitated from the boundaries of the grains.

15. The method of claim 13, wherein the doping of the p-doped polysilicon layer comprises doping with As ions.

16. The method of claim 15, wherein the doping density of the As ions is 1E19 to 5E20 ions/cm$^3$.

17. The method of claim 13, wherein the metal layer is made from a material selected from the group consisting of Ti, W, Mo, Co, Ta, and Pt.

18. The method of claim 13, wherein the p-type impurity ions include a Group IIIB element.

19. The method of claim 13, wherein the formed polysilicon layer on the gate insulating layer is an undoped polysilicon layer.

20. The method of claim 13, wherein the polysilicon layer is made from columnar polysilicon.

21. The method of claim 13, wherein reacting the metal layer with the twice-doped polysilicon of the gate electrode and the impurity diffusion regions comprises annealing the metal layer formed on the twice-doped polysilicon of the gate electrode and the impurity diffusion regions.

22. The method of claim 17, wherein the metal-silicon compound layer is Co.

23. The method of claim 13, wherein forming a metal layer comprises sputtering a metal to form a metal layer.

24. A method of forming a gate electrode comprising:
forming a gate insulating layer on a semiconductor substrate;
forming a polysilicon layer comprising grains on the semiconductor substrate;
doping the polysilicon layer with p-type impurity ions;
doping the p-doped polysilicon layer with opposite type impurities for increasing the size of the grains;
forming a metal layer on the twice-doped polysilicon layer;
reacting the metal layer and the twice-doped polysilicon layer to obtain a silicon-metal compound layer on the twice-doped polysilicon layer to obtain a silicon-metal compound layer on the twice-doped polysilicon layer; and
patterning the silicon-metal compound layer, the twice-doped polysilicon layer, and the gate insulating layer to obtain a gate electrode having a gate insulating layer interposed between the gate electrode and the semiconductor substrate.

25. A method of forming a PMOS transistor comprising:
forming a gate insulating layer on a semiconductor substrate;
forming a polysilicon layer comprising grains on the semiconductor substrate;
doping the polysilicon layer with p-type impurity ions;
doping the p-doped polysilicon layer with opposite type impurities for increasing the size of the grains;
forming a metal layer on the twice-doped polysilicon layer;
reacting the metal layer and the twice-doped polysilicon layer to obtain a silicon-metal compound layer on the twice-doped polysilicon layer;
patterning the silicon-metal compound layer, the twice-doped polysilicon layer, and the gate insulating layer to obtain a gate electrode having a gate insulating layer interposed between the gate electrode and the semiconductor substrate;
forming impurity diffusion regions adjacent to the gate electrode; and
forming an insulating sidewall on the gate electrode.

26. A method for forming a semiconductor device comprising:
forming a gate insulating layer on semiconductor substrate;
forming a polysilicon layer comprising grains on the gate insulating layer;
doping the polysilicon layer with p-type impurity ions;
doping the p-doped polysilicon layer with opposite type impurities for increasing the size of the grains;
patterning the twice-doped polysilicon layer and the gate insulating layer to obtain a gate electrode formed on the gate insulating layer;
forming impurity diffusion regions in the semiconductor substrate adjacent to the gate electrode;
forming an insulating sidewall on a side of the gate electrode;
forming a metal layer over the gate electrode and the impurity diffusion regions; and
reacting the metal layer with the twice-doped polysilicon of the gate electrode and the impurity diffusion regions to obtain a metal-silicon compound layer formed on the gate electrode and the impurity diffusion regions, respectively.

27. A method of forming a gate electrode comprising:
forming a gate insulating layer on a semiconductor substrate;
forming a polysilicon layer comprising grains on the semiconductor substrate;
doping the polysilicon layer with p-type impurity ions;
redoping the p-doped polysilicon layer with n-type impurities for increasing the grain size in the p-type polysilicon layer;
forming a metal layer on the twice-doped polysilicon layer;
reacting the metal layer and the twice-doped polysilicon layer to obtain a silicon-metal compound layer on the twice-doped polysilicon layer to obtain a silicon-metal compound layer on the twice-doped polysilicon layer; and
patterning the silicon-metal compound layer, the twice-doped polysilicon layer, and the gate insulating layer to obtain a gate electrode having a gate insulating layer interposed between the gate electrode and the semiconductor substrate.

28. A method of forming a PMOS transistor comprising:
forming a gate insulating layer on a semiconductor substrate;
forming a polysilicon layer comprising grains on the semiconductor substrate;
doping the polysilicon layer with p-type impurity ions;
redoping the p-doped polysilicon layer with n-type impurities for increasing the grain size in the p-type polysilicon layer;
forming a metal layer on the twice-doped polysilicon layer;
reacting the metal layer and the twice-doped polysilicon layer to obtain a silicon-metal compound layer on the twice-doped polysilicon layer;
patterning the silicon-metal compound layer, the twice-doped polysilicon layer, and the gate insulating layer to obtain a gate electrode having a gate insulating layer interposed between the gate electrode and the semiconductor substrate;
forming impurity diffusion regions adjacent to the gate electrode; and
forming an insulating sidewall on the gate electrode.

29. A method for forming a semiconductor device comprising:
forming a gate insulating layer on semiconductor substrate;

forming a polysilicon layer comprising grains on the gate insulating layer;

doping the polysilicon layer with p-type impurity ions;

redoping the p-doped polysilicon layer with n-type impurities for increasing the grain size in the p-type polysilicon layer;

patterning the twice-doped polysilicon layer and the gate insulating layer to obtain a gate electrode formed on the gate insulating layer;

forming impurity diffusion regions in the semiconductor substrate adjacent to the gate electrode;

forming an insulating sidewall on a side of the gate electrode;

forming a metal layer over the gate electrode and the impurity diffusion regions; and reacting the metal layer with the twice-doped polysilicon of the gate electrode and the impurity diffusion regions to obtain a metal-silicon compound layer formed on the gate electrode and the impurity diffusion regions, respectively.

* * * * *